(12) United States Patent
Watanabe

(10) Patent No.: US 9,099,464 B2
(45) Date of Patent: Aug. 4, 2015

(54) SEMICONDUCTOR DEVICE HAVING CAPACITOR CAPABLE OF REDUCING ADDITIONAL PROCESSES AND ITS MANUFACTURE METHOD

(75) Inventor: Kenichi Watanabe, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 498 days.

(21) Appl. No.: 13/330,630

(22) Filed: Dec. 19, 2011

(65) Prior Publication Data

US 2012/0086105 A1   Apr. 12, 2012

Related U.S. Application Data

(62) Division of application No. 11/505,945, filed on Aug. 18, 2006, now Pat. No. 8,264,062.

(30) Foreign Application Priority Data

Jan. 27, 2006   (JP) .................................. 2006-018343

(51) Int. Cl.
*H01L 29/00*   (2006.01)
*H01L 23/522*   (2006.01)
*H01L 21/768*   (2006.01)

(52) U.S. Cl.
CPC ...... *H01L 23/5223* (2013.01); *H01L 21/76802* (2013.01); *H01L 21/76832* (2013.01); *H01L 21/76834* (2013.01); *H01L 2924/0002* (2013.01)

(58) Field of Classification Search
CPC ................. H01L 2924/0002; H01L 21/76832; H01L 21/76834
USPC ............................ 257/295–310, 532, E23.149
See application file for complete search history.

(56) References Cited

U.S. PATENT DOCUMENTS 6,184,551 B1   2/2001  Lee et al.
6,222,269 B1   4/2001  Usami
(Continued)

FOREIGN PATENT DOCUMENTS

JP   10-189716   7/1998
JP   2003-51501 A   2/2003
(Continued)

OTHER PUBLICATIONS

M. Armacost et al., "A High Reliability Metal Insulator Metal Capacitor for 0.18 μm Copper Technology", IEDM2000, pp. 157-160.
(Continued)

*Primary Examiner* — Cuong Q Nguyen
(74) *Attorney, Agent, or Firm* — Fujitsu Patent Center

(57) ABSTRACT

A first capacitor recess and a wiring trench are formed through an interlayer insulating film. A lower electrode fills the first capacitor recess, and a first wiring fills the wiring trench. An etching stopper film and a via layer insulating film are disposed over the interlayer insulating film. A first via hole extends through the via layer insulating film and etching stopper film and reaches the first wiring, and a first plug fills the first via hole. A second capacitor recess is formed through the via layer insulating film, the second capacitor recess at least partially overlapping the lower electrode, as viewed in plan. The upper electrode covers the bottom and side surfaces of the second capacitor recess. A capacitor is constituted of the upper electrode, etching stopper film and lower electrode. A second wring connected to the first plug is formed over the via layer insulating film.

5 Claims, 11 Drawing Sheets

(56) References Cited

U.S. PATENT DOCUMENTS

| | | | |
|---|---|---|---|
| 6,399,495 | B1 | 6/2002 | Tseng et al. |
| 6,667,491 | B2 | 12/2003 | Yoneda |
| 6,680,542 | B1 | 1/2004 | Gibson et al. |
| 6,759,703 | B1 | 7/2004 | Matsuhashi |
| 7,180,117 | B2 | 2/2007 | Won |
| 7,239,004 | B2 * | 7/2007 | Park et al. ............ 257/529 |
| 7,807,567 | B2 | 10/2010 | Kawano et al. |
| 2002/0179955 | A1 * | 12/2002 | Morimoto et al. ............ 257/306 |
| 2003/0025143 | A1 | 2/2003 | Lin et al. |
| 2004/0113190 | A1 * | 6/2004 | Oh et al. ............ 257/296 |
| 2004/0152256 | A1 | 8/2004 | Noguchi et al. |
| 2005/0212082 | A1 | 9/2005 | Takeda et al. |
| 2006/0006441 | A1 | 1/2006 | Park et al. |

FOREIGN PATENT DOCUMENTS

| | | |
|---|---|---|
| JP | 2004-311941 | 11/2004 |
| JP | 2005-101618 | 4/2005 |

OTHER PUBLICATIONS

USPTO, (Nguyen) Restriction Requirement, Aug. 27, 2008, in U.S. Appl. No. 11/505,945 [now allowed].

USPTO, (Nguyen) Restriction Requirement, Dec. 18, 2008, in U.S. Appl. No. 11/505,945 [now allowed].

USPTO, (Nguyen) Non-Final Office Action, May 13, 2009, in U.S. Appl. No. 11/505,945 [now allowed].

USPTO, (Nguyen) Final Office Action, Jan. 5, 2010, in U.S. Appl. No. 11/505,945 [now allowed].

USPTO, (Nguyen) Non-Final Office Action, Aug. 19, 2010, in U.S. Appl. No. 11/505,945 [now allowed].

USPTO, (Nguyen) Final Office Action, Apr. 6, 2011, in U.S. Appl. No. 11/505,945 [now allowed].

USPTO, (Nguyen) Advisory Action, Sep. 16, 2011, in U.S. Appl. No. 11/505,945 [now allowed].

USPTO, (Nguyen) Notice of Allowance and Notice of Allowability, Oct. 18, 2011, in U.S. Appl. No. 11/505,945 [now allowed].

Japanese Office Action mailed Jan. 10, 2012 for corresponding Japanese Application No. 2006-018343, with English-language translation.

USPTO [Nguyen] Non-Final Rejection, Jan. 7, 2013, in U.S. Appl. No. 13/495,000 [pending].

USPTO [Doan] "U.S. Appl. No. 13/495,000 (related)," [NOA] Notice of Allowance issued on Apr. 30, 2013 (allowed).

USPTO, (Nguyen) Non-Final Rejection, Oct. 2, 2014, in U.S. Appl. No. 13/495,001 [pending].

USPTO, (Nguyen) Issue Notification, Jan. 11, 2012, in U.S. Appl. No. 11/505,945 [allowed].

USPTO, (Nguyen) Patent Withdrawal Notice, Jan. 25, 2012, in U.S. Appl. No. 11/505,945 [allowed].

USPTO, (Nguyen) Notice of Allowance and Notice of Allowability, Mar. 2, 2012, in U.S. Appl. No. 11/505,945 [allowed].

USPTO, (Nguyen) Requirement for Restriction/Election, Jun. 19, 2014, in U.S. Appl. No. 13/495,001 [pending].

USPTO, [Nguyen], Final Rejection mailed May 7, 2015, in U.S. Appl. No. 13/495,001 [pending].

* cited by examiner

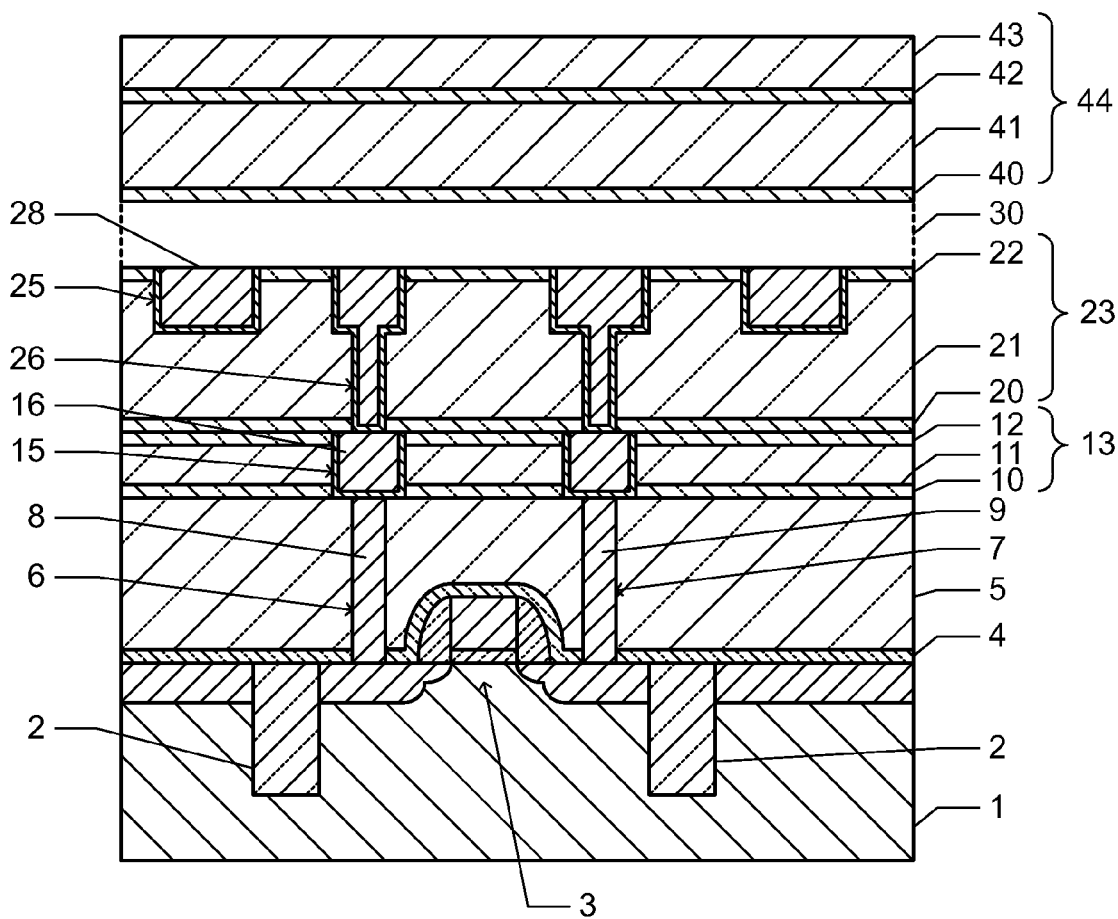
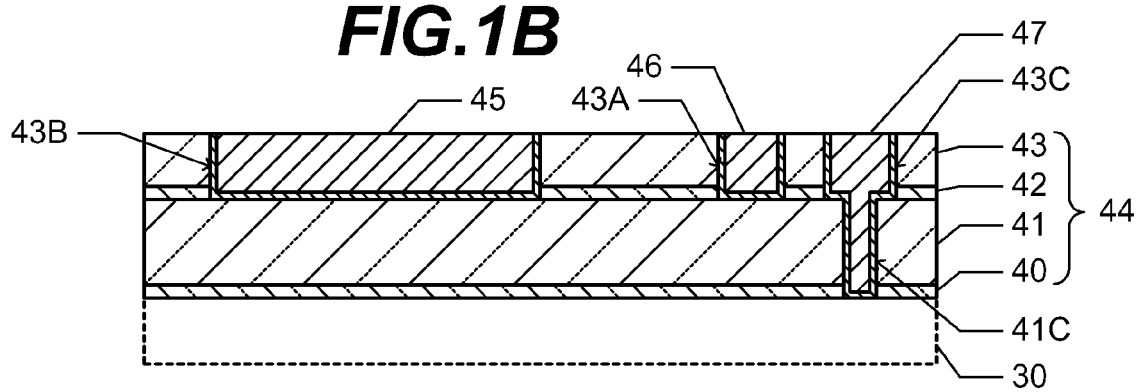

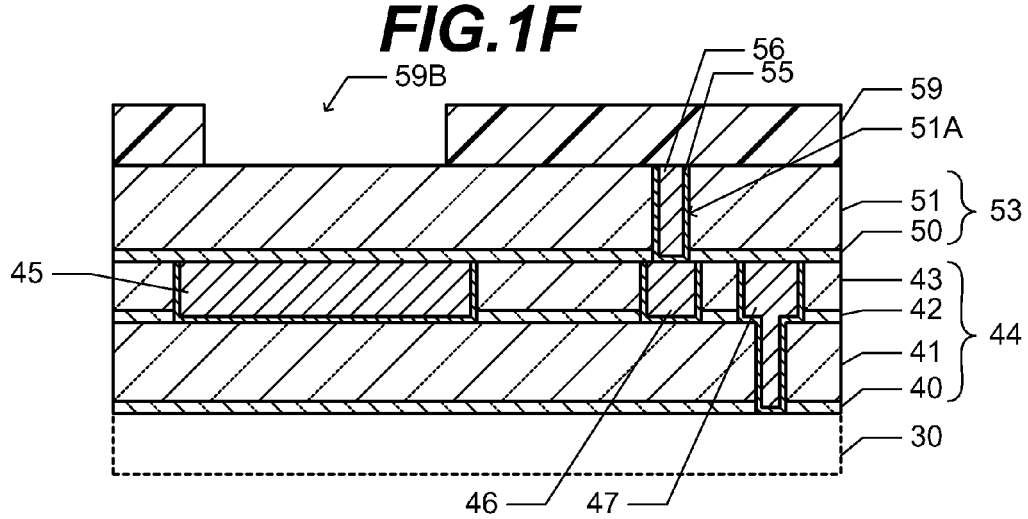
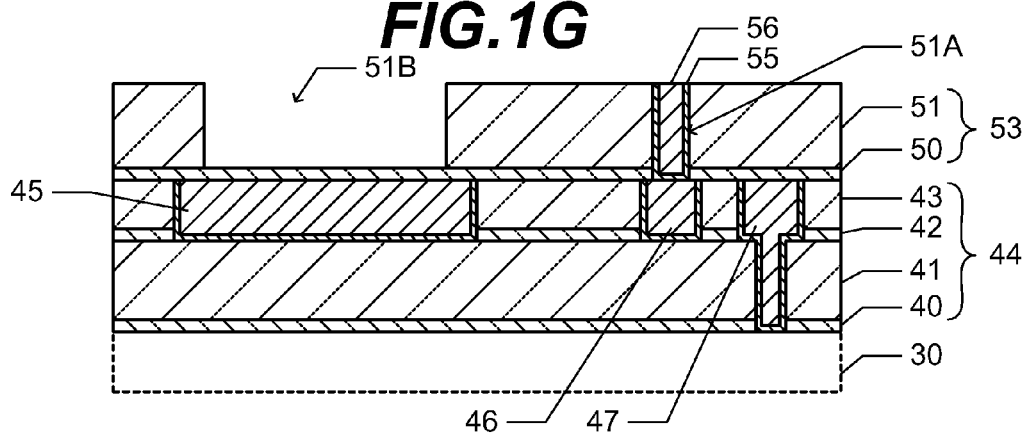
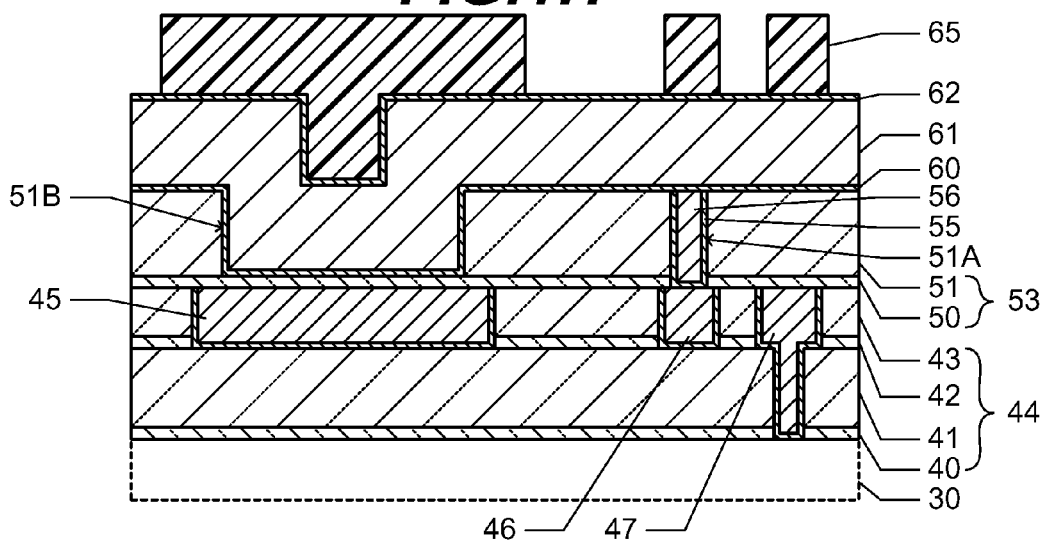

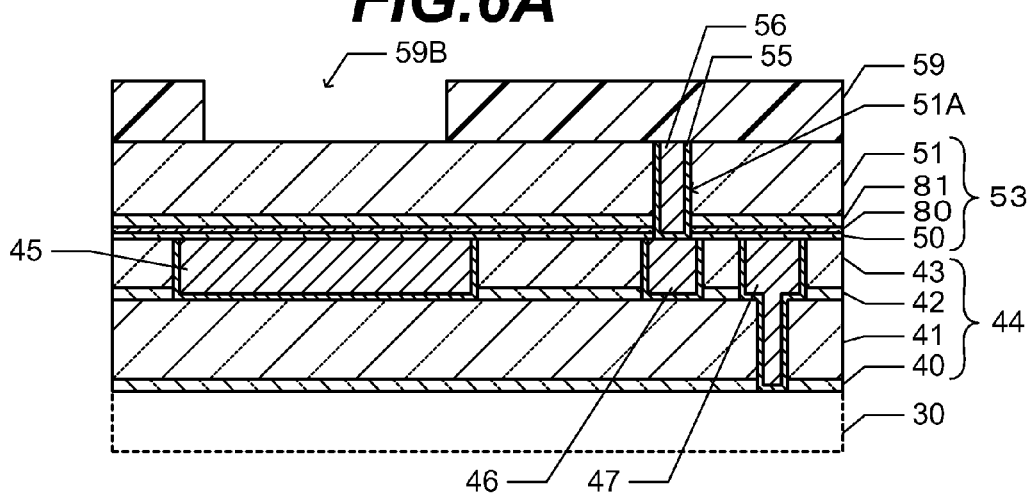
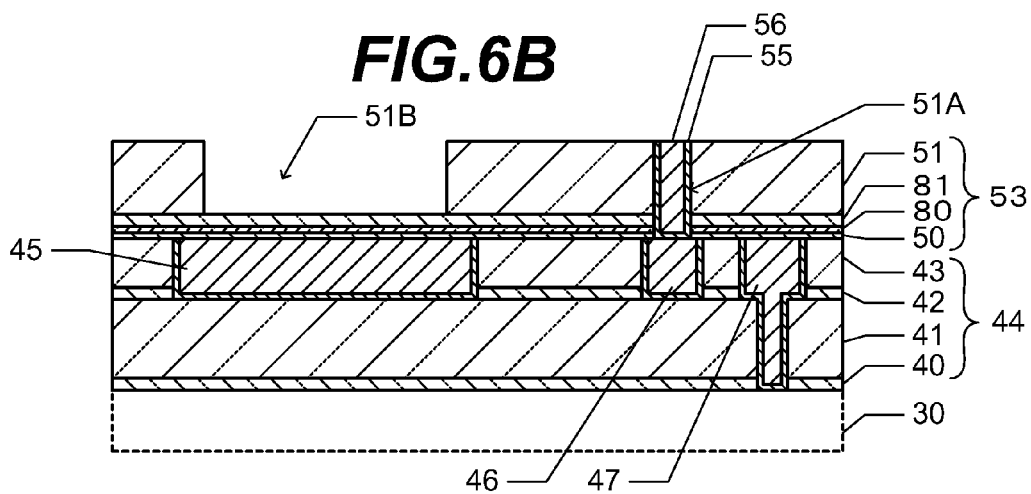
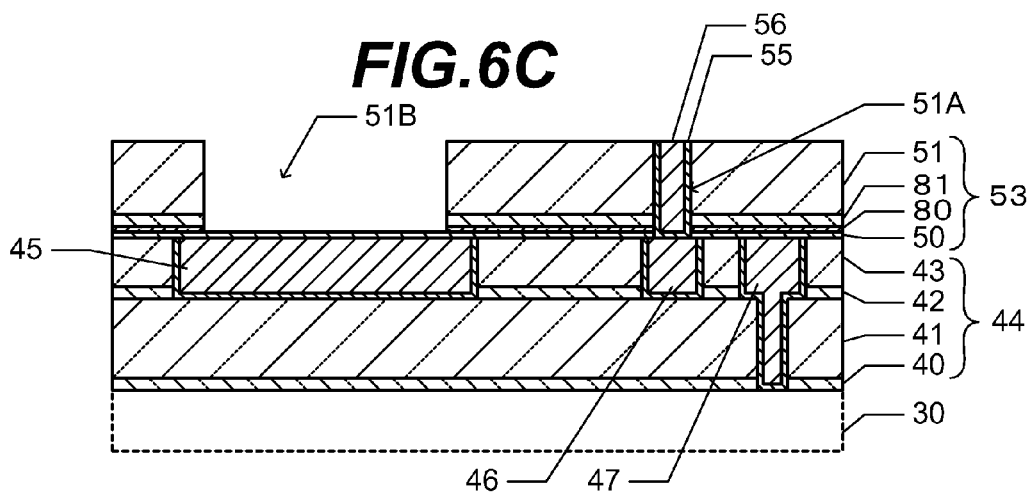

SEMICONDUCTOR DEVICE HAVING CAPACITOR CAPABLE OF REDUCING ADDITIONAL PROCESSES AND ITS MANUFACTURE METHOD

CROSS REFERENCE TO RELATED APPLICATION

This application is based on and claims priority of Japanese Patent Application No. 2006-018343 filed on Jan. 27, 2006, the entire contents of which are incorporated herein by reference.

BACKGROUND OF THE INVENTION

A) Field of the Invention

The present invention relates to a semiconductor device and its manufacture method, and more particularly to a semiconductor device having capacitors and its manufacture method.

B) Description of the Related Art

Generally, a high frequency analog integrated circuit used in a mobile communication field or the like requires passive elements such as resistors, capacitors and inductors in addition to active elements (transistors and the like) operable at high speed, because of the characteristics of signals to be processed. In order to improve an operation speed and reduce a consumption power, it is necessary to reduce parasitic capacitance and resistance. In order to reduce parasitic capacitance and resistance, a capacitor of a metal-insulator-metal (MIM) structure is used more than a capacitor of a metal-oxide-semiconductor (MOS) structure.

FIG. 7 is a cross sectional view of a semiconductor device having wirings formed by a damascene method and capacitors of a MIM structure. A capacitor of the MIM structure having a structure similar to that shown in FIG. 7 is disclosed in "A high Reliability Metal Insulator Metal Capacitor for 0.18 μm Copper Technology" by M. Armacost, et. al., IEDM2000, pp. 157-160. In the following, a manufacture method for the semiconductor device shown in FIG. 7 will be described.

An etching stopper film 101 of SiN and an interlayer insulating film 102 of SiO$_2$ are formed on an interlayer insulating film 100. A wiring trench is formed through these two films and a copper wiring 103 is embedded in this wiring trench. On the interlayer insulating film 102, an etching stopper film 106 of SiN is formed, having a copper diffusion prevention and etching stopper function. A SiO$_2$ film 112 is thinly formed on the etching stopper film 106. This SiO$_2$ film 112 is not essential. A recess 110 is formed extending from the upper surface of the SiO$_2$ film 112 to the upper surface of the interlayer insulating film 100.

A TiN film as a lower electrode 115A, an SiO$_2$ film as a capacitor dielectric film 116A, a TiN film as an upper electrode 117A and an SiN film as an upper insulating film 118A are sequentially deposited on the whole surface of the substrate. These four layers are deposited also on the inner surface of the recess 110. The four layers from the lower side TiN film to the SiN film are patterned in a shape of the lower electrode 115A. In this case, a step formed in the recess 110 is used as an alignment mark. Since the upper surface of the interlayer insulating film 102 is flat, the position of the lower level wiring 103 cannot be detected after the TiN film is formed on the interlayer insulating film 102. The recess 110 is therefore formed to use it as the alignment mark.

Next, the SiO$_2$ film, upper level TiN film and SiN film are patterned in a shape of the upper electrode 117A. A capacitor 119 is constituted of the lower electrode 115A of TiN, capacitor dielectric film 116A of SiO$_2$, and upper electrode 117A of TiN. The TiN film 115B, SiO$_2$ film 116B, upper TiN film 117B and SiN film 118B are also left on the inner surface of the recess 110.

When the lower electrode 115A is formed, an alignment mark is formed at a position different from the lower electrode 115A. By using this alignment mark, alignment is performed when the SiO$_2$ film, upper TiN film and SiN film are patterned in the shape of the upper electrode 117A. Depending upon the an allowable range of position alignment precision of the upper and lower electrodes, the step in the recess 110 can be used as the alignment mark when pattering into the shape of the upper electrode 117A.

An interlayer insulating film 120 is formed covering the capacitor 119, and the surface of the interlayer insulating film 120 is planarized. Via holes 122A, 122B and 122C are formed through the interlayer insulating film 120. The via hole 122A passes beside the upper electrode 117A and exposes the upper surface of the lower electrode 115A. The via hole 122B passes through the upper insulating film 118A and exposes the upper surface of the upper electrode 117A. The via hole 122C passes through the SiO$_2$ film 112 and etching stopper film 106 and exposes the upper surface of the lower level wiring 103.

After the inner surfaces of these via holes 122A, 122B and 122C are covered with a barrier metal film, plugs made of tungsten (W) are embedded in the via holes. Wirings 125A, 125B and 125C of aluminum (Al) or the like are formed on the interlayer insulating film 120. The wirings 125A, 125B and 125C are connected to the plugs embedded in the via holes 122A, 122B and 122C, respectively.

With the above-described manufacture method, it is necessary to conduct photolithography once at each of the process of forming the recess 110, the process of patterning the lower electrode 115A and the process of patterning the upper electrode 117A. Namely, three photolithography processes are newly added as compared to the case in which the capacitor 119 is not formed.

With reference to FIGS. 8A to 8D, description will be made on a method for manufacturing a capacitor of the MIM structure disclosed in JP-A-2003-51501.

As shown in FIG. 8A, a wiring 152 is embedded in a wiring recess formed in an interlayer insulating film 150, and a lower electrode 151 is embedded in a capacitor recess. An etching stopper film 155 is formed on the interlayer insulating film 150, lower electrode 151 and wiring 152. An interlayer insulating film 156 is formed on the etching stopper film. A capacitor recess 156A is formed through the interlayer insulting film 156. The recess 156A partially overlaps the lower electrode 151 as viewed in plan.

A barrier metal film is formed on the whole substrate surface, and a conductive film is deposited on the barrier metal film. Chemical mechanical polishing (CMP) is performed until the upper surface of the interlayer insulating film 156 is exposed. An upper electrode 158 is therefore formed as shown in FIG. 8B, being made of the conductive film left in the recess 156A.

As shown in FIG. 8C, an etching stopper film 160 is formed on the interlayer insulating film 156 and upper electrode 158, and an interlayer insulating film 161 is formed on the etching stopper film 160.

As shown in FIG. 8D, a recess 161B is formed through the interlayer insulating film 161 and etching stopper film 160, and a via hole 156B is formed extending from the bottom of the recess 161B to the upper surface of the wiring 152. As viewed in plan, the recess 161B overlaps the upper electrode 158 and low-level wiring 152. The upper electrode 158 is exposed on a partial bottom of the recess 161B, and the upper surface of the wiring 152 is exposed on the bottom of the via hole 156B.

The inner surfaces of the recess 161B and via hole 156B are covered with a barrier metal film, and the recess 161B and via hole 156B are filled with a conductive member 163. A capacitor is therefore formed by the lower electrode 151 and upper electrode 158 and the etching stopper 155 disposed between the two electrodes. The upper electrode 158 is connected via the conductive member 163 to the wiring 152 formed in the same layer as that of the lower electrode 151.

SUMMARY OF THE INVENTION

In order to form the capacitor by the method illustrated in FIGS. 8A to 8D, new processes are added including a process of forming the recess 156A shown in FIG. 8A, a process of filling the recess 156A with the conductive film and a CMP process.

It is an object of the present invention to provide a semiconductor device and its manufacture method having the reduced number of additional processes necessary for forming a capacitor.

According to one aspect of the present invention, there is provided a semiconductor device comprising:

a first interlayer insulating film formed over a semiconductor substrate;

a first capacitor recess and a wiring trench formed through the first interlayer insulating film;

a lower electrode embedded in the first capacitor recess;

a first wiring embedded in the wiring trench;

a first etching stopper film disposed over the first interlayer insulating film;

a via layer insulating film disposed over the first etching stopper film and made of insulating material having an etching resistance different from an etching resistance of the first etching stopper film;

a first via hole formed through the via layer insulating film and the first etching stopper film and reaching an upper surface of the first wiring;

a first plug made of conductive material embedded in the first via hole;

a second capacitor recess formed through the via layer insulating film and reaching the first etching stopper film, the second capacitor recess at least partially overlapping the lower electrode as viewed in plan;

an upper electrode disposed covering a bottom surface and a side surface of the second capacitor recess and a partial upper surface of the via layer insulating film continuous with the second capacitor recess, the upper electrode and the lower electrode constituting a capacitor comprising the first etching stopper film as a capacitor dielectric film; and a second wiring formed over the via layer insulating film and connected to the first plug.

According to another aspect of the present invention, there is provided a method of manufacturing a semiconductor device comprising steps of:

(a) forming a first interlayer insulating film over a semiconductor substrate;

(b) forming a first capacitor recess and a wiring trench through the first interlayer insulating film;

(c) embedding a lower electrode and a first wiring in the first capacitor recess and the wiring trench, respectively;

(d) covering upper surfaces of the first interlayer insulating film, the lower electrode and the first wiring with a first etching stopper film;

(e) forming a via layer insulating film over the first etching stopper film, the via layer insulating film being made of insulating material having an etching resistance different from an etching resistance of the first etching stopper film;

(f) forming a first via hole through the via layer insulating film and the first etching stopper film to expose a portion of the first wiring;

(g) embedding a first conductive plug in the first via hole;

(h) forming a second capacitor recess through the via layer insulating film to leave at least a portion of the first etching stopper film on a bottom of the second capacitor recess, the second capacitor recess at least partially overlapping the lower electrode, as viewed in plan;

(i) forming a conductive film covering an inner surface of the second capacitor recess, an upper surface of the first plug and an upper surface of the via layer insulating film; and (j) patterning the conductive film to leave an upper electrode in the second capacitor recess and a second wiring connected to the first plug.

The lower electrode of the capacitor is formed by the same process as that of forming the wiring in the same layer. The upper electrode is formed by the same process for the second wiring. A capacitor can therefore be formed by newly adding only the process of forming the second capacitor recess.

BRIEF DESCRIPTION OF THE DRAWINGS

FIGS. 1A to 1I are cross sectional views of a semiconductor device during manufacture according to a first embodiment.

FIGS. 6A to 6C are cross sectional views of a semiconductor device during manufacture according to a third embodiment.

DESCRIPTION OF THE PREFERRED EMBODIMENTS

Figure 1C:
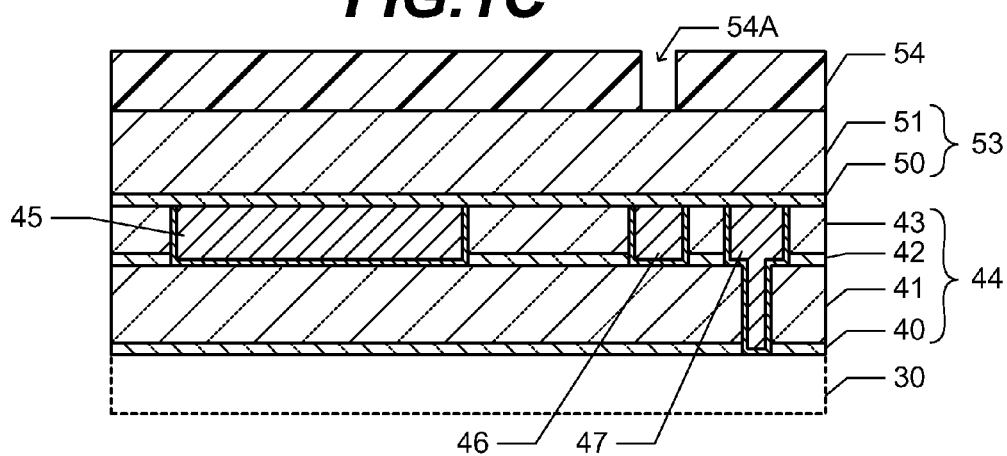

With reference to FIGS. 1A to 1J, description will be made on a method for manufacturing a semiconductor device according to the first embodiment.

As shown in FIG. 1A, an isolation insulating film 2 of a shallow trench isolation (STI) structure is formed in a surface layer of a semiconductor substrate 1 made of silicon. A MOSFET 3 is formed in an active region defined by the isolation insulating film 2. An etching stopper film 4 of SiN is formed on the surface of the semiconductor substrate 1, covering MOSFET 3. A first-layer interlayer insulating film 5 of phosphosilicate glass (PSG) or the like is formed on the etching stopper film 4. Via holes 6 and 7 are formed through the first-layer interlayer insulating film 5 and etching stopper film 4, and filled with plugs 8 and 9 made of W or the like, respectively. The plugs 8 and 9 are connected to source/drain regions of MOSFET 3, respectively. The inner surfaces of the via holes 6 and 7 are covered with a barrier metal film of TiN or the like.

On the first-layer interlayer insulating film 5, a second-layer interlayer insulating film 13 is formed, consisting of three layers: an etching stopper film 10 of SiC or the like, an insulating film 11 of SiOC or the like and a cap film 12 of $SiO_2$. A plurality of wiring trenches 15 are formed through the interlayer insulating film 13. The inner surface of the wiring trench 15 is covered with a barrier metal film of Ta or the like, and the inside of the wiring trench is filled with a conductive member 16 made of copper. The conductive member 16 in the wiring trench 15 constitutes a first-layer wiring. The wiring trench 15 and conductive member 16 are formed by a single damascene method.

On the second-layer interlayer insulating film 13, a third-layer interlayer insulating film 23 is formed, consisting of three layers: an etching stopper film 20 of SiC or the like, an insulating film 21 of SiOC or the like and a cap film 22 of $SiO_2$. A plurality of wiring trenches 25 and via holes 26 are formed in the interlayer insulating film 23. The inner surfaces of the wiring trench 25 and via hole 26 are covered with a barrier metal film of Ta or the like, and the inside thereof is filled with a conductive member 28 of copper. The conductive member 28 in the wiring trench 25 constitutes a wiring, and the conductive member 28 in the via hole 26 constitutes an interconnect portion between the upper and lower wirings. The wiring trench 25, via hole 26 and conductive member 28 are formed by a dual damascene method.

On the third-layer interlayer insulating film 23, a plurality of wiring layers are formed by a dual damascene method as in the case of the third-layer wiring structure.

An interlayer insulating film 44 of a four-layer structure is formed on the wiring layer 30. The interlayer insulating film 44 has a lamination structure of: an etching stopper film 40 made of insulating material having a different etching resistance from that of the underlying surface, e.g., SiN and having a thickness of 50 nm; a via layer insulating film 41 made of insulating material having a different etching resistance from that of the etching stopper film 40, e.g., $SiO_2$ and having a thickness of 600 nm; an etching stopper film 42 made of material having a different etching resistance from that of the via layer insulating film 41, e.g., SiN and having a thickness of 50 nm; and a wiring layer insulating film 43 made of material having a different etching resistance from that of the etching stopper film 42, e.g., $SiO_2$ and having a thickness of 350 nm stacked in this order. These films are, for example, deposited by chemical vapor deposition (CVD).

As shown in FIG. 1B, a wiring is formed in the interlayer insulating film 44 by a dual damascene method. FIGS. 1B to 1J show only the lamination structure above the wiring layer 30. In the following, a wiring forming method using a dual damascene method will be described.

First, a via hole 41C is formed extending from the upper surface of the wiring layer insulating film 43 to the bottom of the via layer insulating film 41. Next, wiring trenches 43A and 43C and a capacitor recess 43B are formed reaching the upper surface of the via layer insulating film 41. The wiring trench 43C overlaps the via hole 41C. When the wiring layer insulating film 43 is etched to form the wiring trenches, a protective member made of resin is embedded in a lower partial region in the via hole 41C to protect the etching stopper film 40 exposed on the bottom. After the wiring layer insulating film 43 is etched, the protective member and a resist mask used as an etching mask are removed. Further, the etching stopper film 42 exposed on the bottoms of the wiring trenches 43A and 43C and capacitor recess 43B and the etching stopper film 40 exposed on the bottom of the via hole 41C are removed.

A barrier metal film of Ta or the like having a thickness of 30 nm is formed covering the whole exposed surface. After a seed film of copper is formed by sputtering, copper is electroplated to form a conductive film. CMP is performed until the upper surface of the wiring layer insulating film 43 is exposed. Therefore, a copper wiring 46 is left in the wiring trench 43A, a copper wiring 47 is left in the wiring trench 43C and via hole 41C, and a lower electrode 45 of copper is left in the capacitor recess 43B. The wiring 47 is connected to the low-level wiring via the plug filling the via hole 41C. The plug in the via hole 41C is integrated with the wiring 47 as one body. The lower electrode 45 and wirings 46 and 47 may be made of alloy containing copper as its main component, Al, Cu-containing Al including Cu about 0.5 to 1.0 wt %, or the like.

If the lower electrode 45 and the like are to be made of Cu, alloy containing Cu as its main component or the like, Ta, TaN, TiN or the like is used as material of a barrier metal film. If the lower electrode 45 and the like are to be made of Al, Cu-containing Al or the like, TiN is used as material of a barrier metal film. A Ti film may be deposited between the insulating film and TiN film and between the Al film and TiN film to improve adhesion.

As shown in FIG. 1C, an interlayer insulating film 53 is formed by chemical vapor deposition (CVD), covering the interlayer insulating film 44, lower electrode 45 and wirings 46 and 47, the interlayer insulating film having a two-layer structure of an etching stopper film 50 and a via layer insulating film 51. The etching stopper film 50 is made of insulating material having an etching resistance different from that of the underlying wiring layer insulating film 43, e.g., SiN, and has a thickness of 70 nm. The etching stopper film 50 has also a Cu diffusion preventive function. The via layer insulating film 51 is made of insulating material having an etching resistance different from that of the etching stopper film 50, e.g., $SiO_2$, and has a thickness of 1000 nm. The via layer insulating film 51 may be formed to a thickness thicker than 1000 nm and the surface thereof is planarized by CMP.

A resist film 54 is formed on the interlayer insulating film 53, and exposed and developed to form an opening 54A through the resist film 54. The opening 54A is located within the low-level wiring 46 as viewed in plan, and its plan shape size is about 0.5 to 0.7 µm. By using the resist film 54 as a mask, the via layer insulating film 51 is etched by plasma etching using CF-based gas. The resist film 54 is removed by plasma ashing using $O_2$-containing gas. Thereafter, the etching stopper film 50 exposed on the bottom of the via hole 51A is removed by plasma etching using CHF-based gas.

Figure 1D:
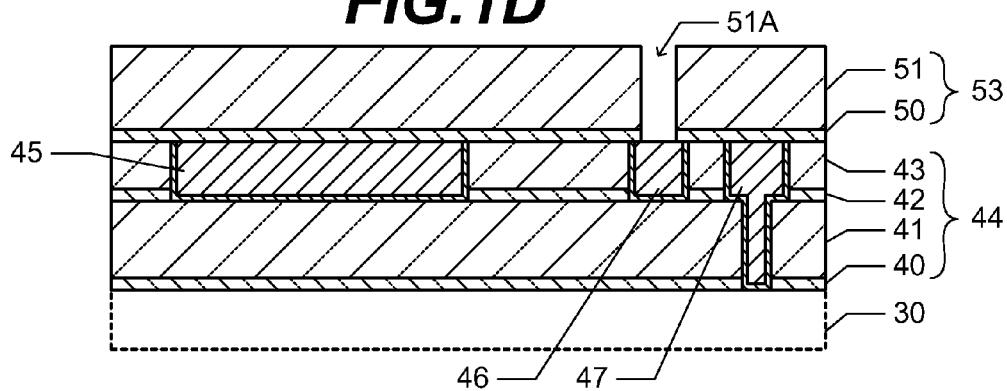

As shown in FIG. 1D, a via hole 51A is therefore formed through the interlayer insulating film 53, and the upper surface of the wiring 46 is exposed on the bottom of the via hole 51A. The via hole 51A has a single damascene structure.

Figure 1E:
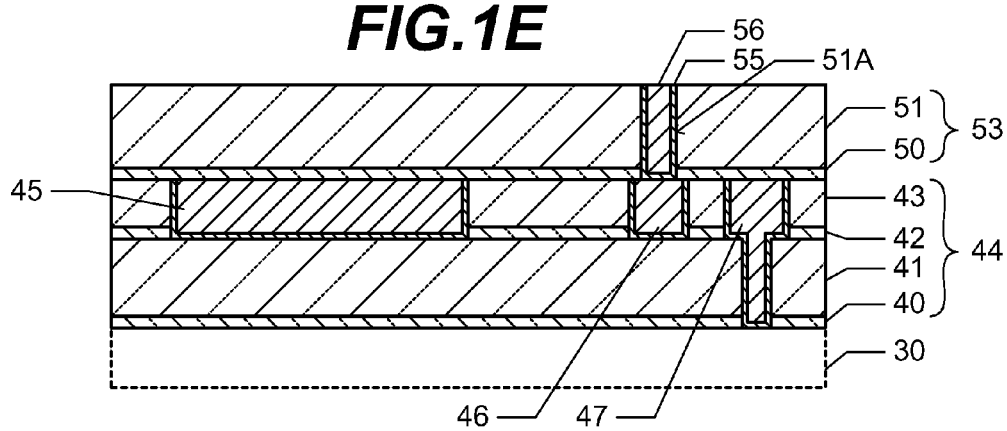

Processes up to the state shown in FIG. 1E will be described. An adhesive layer of TiN having a thickness of 50 nm is formed by sputtering, covering the inner surface of the via hole 51A and the upper surface of the via layer insulating film 51. Next, a conductive film of W having a thickness of 350 nm is deposited by CVD. The via hole 51A is completely filled with the conductive film. CMP is performed until the upper surface of the via layer insulating film 51 is exposed. This CMP leaves a tight adhesion layer 55 of TiN covering the inner surface of the via hole 51A and a plug 56 of W filling the inside of the via hole 51A. The tight adhesion layer 55 may be made of WN, WSiN or the like.

As shown in FIG. 1F, a resist film 59 is formed on the interlayer insulating film 53, and exposed and developed to form an opening 59B. As viewed in plan, the opening 59B is located within the lower electrode 45. The opening 59B and lower electrode 45 may be disposed in such a manner that both are partially overlapped with each other. A plan shape size of the opening 59B is larger than that of the via hole 51A. For example, the plan shape of the opening 59B is a rectangle having the lengths of shorter and longer sides of, e.g., about 3 to 5 μm and 10 μm, respectively.

By using the resist film 59 as a mask, the via layer insulating film 51 is etched to expose the etching stopper film 50. For example, the via layer insulating film 51 is etched by plasma etching using CF-based gas. After the via layer insulating film 51 is etched, the resist film 59 is removed by plasma ashing using $O_2$ gas.

As shown in FIG. 1G, a capacitor recess 51B is therefore formed in the via layer insulating film 51. As viewed in plan, the capacitor recess 51B is located within the lower electrode 45. As viewed in plan, the area of the capacitor recess 51B is larger than that of the via hole 51A.

A thickness of the etching stopper film 50 exposed on the bottom of the capacitor recess 51B is determined by a ratio (etching selectivity) of an etching rate of the via layer insulating film 51 to an etching rate of the etching stopper film 50 and an over-etching amount when the via layer insulating film 51 is etched. For example, assuming that the etching selectivity is 10 and the over-etching amount is 30%, while the via layer insulating film 51 having a thickness of 1000 nm is etched, the etching stopper film 50 is thinned by 30 nm. Since the thickness of the etching stopper film 50 is set to 70 nm, the thickness of the etching stopper film 50 exposed on the bottom of the capacitor recess 51B is 40 nm.

Processes up to the state shown in FIG. 1H will be described. Three layers, a barrier metal film 60 of TiN having a thickness of 50 nm, a conductive film 61 of AlCu alloy having a thickness of 1000 nm and a barrier metal film 62 of TiN having a thickness of 50 nm, are formed by sputtering, covering the inner surface of the capacitor recess 51B and the upper surface of the via layer insulating film 51. Instead of AlCu alloy, the conductive film 61 may be made of Al or alloy containing Al as its main component. A resist film is formed on the barrier metal film 62, exposed and developed to form a resist pattern 65. The resist pattern 65 covers areas corresponding to wirings and an upper electrode of a capacitor to be formed on the interlayer insulating film 53. By using the resist pattern 65 as a mask, the three layers consisting of the barrier metal film 62, conductive film 61 and barrier metal film 60, are etched.

Figure 1I:
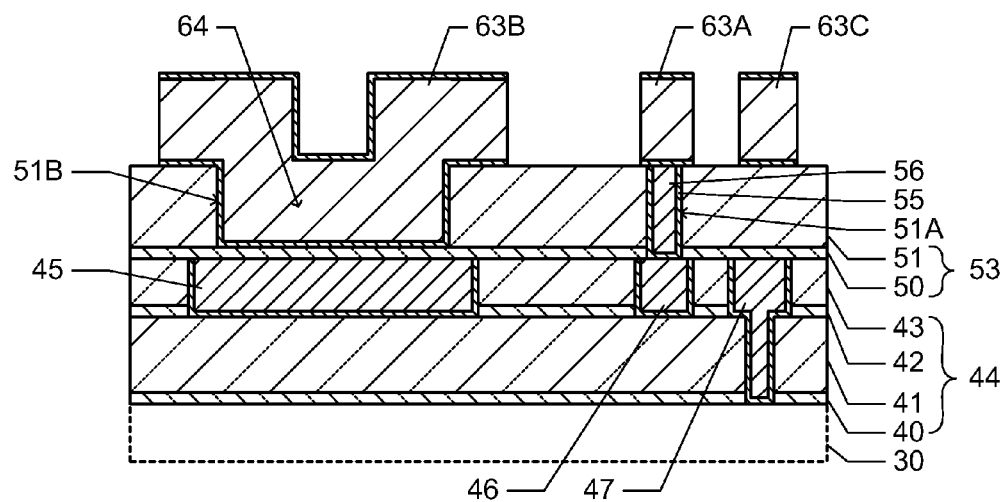

As shown in FIG. 1I, a wiring 63A, a pad 63C and an upper electrode 63B having a three-layer structure are therefore left on the interlayer insulating film 53. All these components have the same lamination structure. The upper electrode 63B covers the inner surface of the capacitor recess 51B and the upper surface of the interlayer insulating film 53 in the region adjacent to the capacitor recess 51B. The lower electrode 45 and upper electrode 63B face each other and sandwich the etching stopper film 50 therebetween, and a capacitor 64 is formed, comprising the etching stopper film 50 as a capacitor dielectric film. The wiring 63A is connected via the plug 56 to the low-level wiring 46.

The upper electrode 63B and the like may have a five-layer structure of TiN/Ti/Al/TiN/Ti stacked in this order from the upper side, or a four-layer structure of TiN/Ti/Al/TiN. The Ti film has also a function of improving adhesion.

Figure 1J:
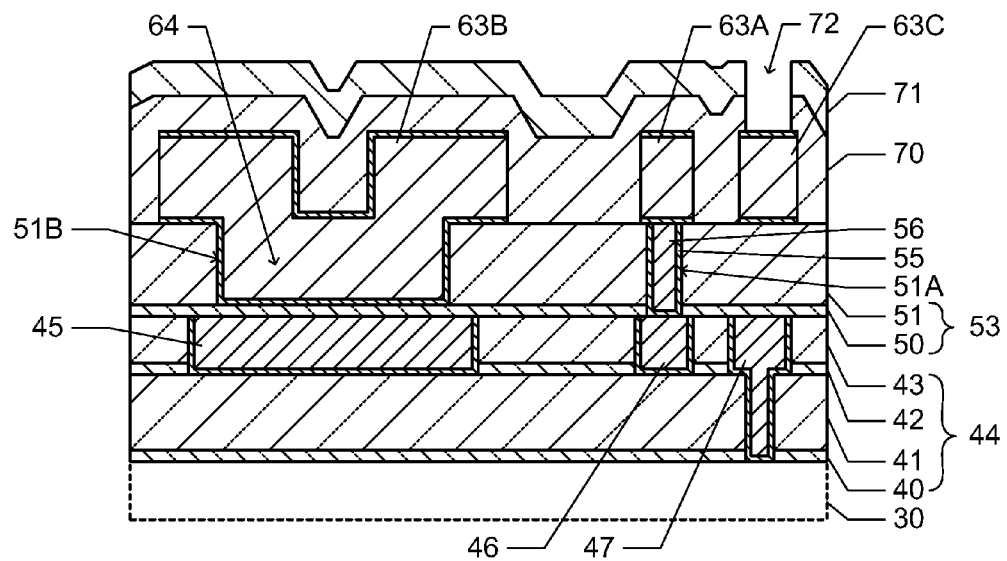
FIG. 1J is a cross sectional view of the semiconductor device of the first embodiment.

As shown in FIG. 1J, a cover film 70 of $SiO_2$ having a thickness of 1000 nm and a cover film 71 of SiN having a thickness of 500 nm are formed on the interlayer insulating film 53 by plasma enhanced CVD, covering the upper electrode 63B, wiring 63A and pad 63C. An opening 72 is formed through the cover films 70 and 71 to expose the pad 63C.

Figure 2:
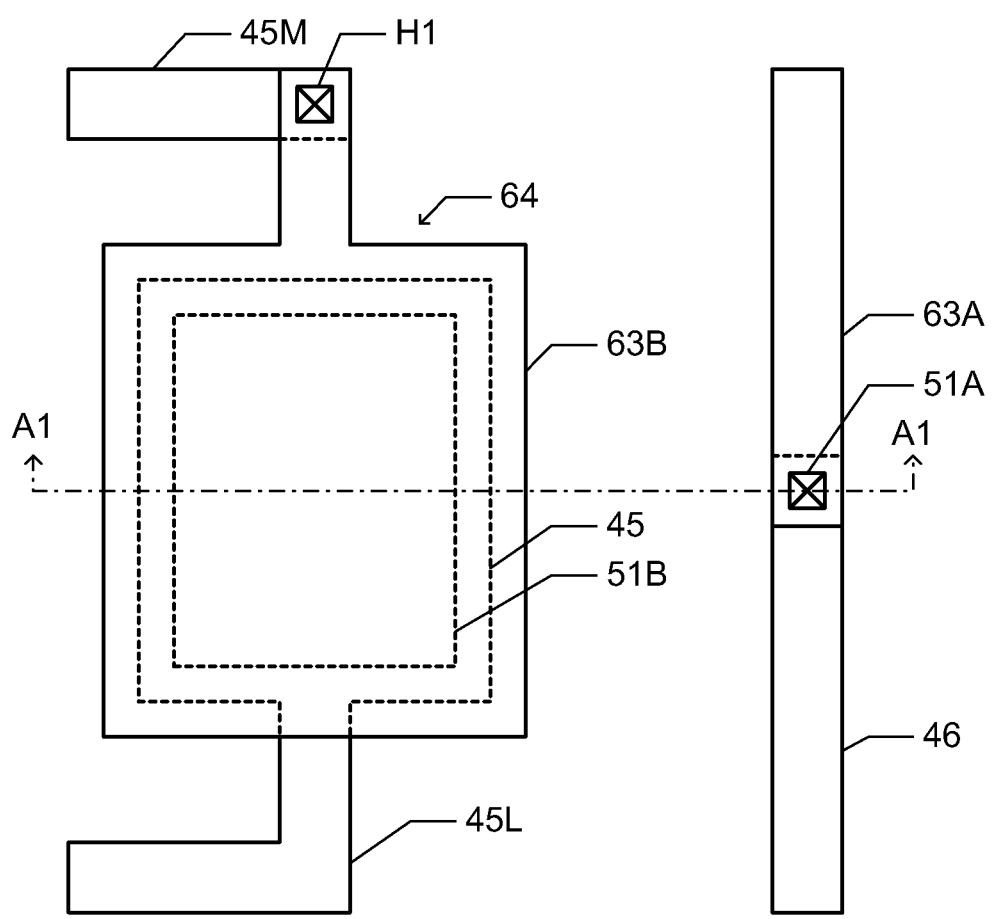
FIG. 2 is a plan view of the semiconductor device according to the first embodiment.

FIG. 2 is a plan view of the capacitor 64 and wiring 63A. A cross sectional view taken along one-dot chain line A1-A1 corresponds to FIGS. 1A to 1J. The capacitor recess 51B for the upper electrode 63B is located within the lower electrode 45. A lead wiring 45L disposed in the same layer as that of the lower electrode 45 is connected to the lower electrode 45. The wiring 45L is embedded in a lead wiring trench formed through the wiring layer insulating film 43 shown in FIG. 1J. The upper electrode 63B is connected via the via hole H1 to a wiring 45M formed in the same layer as that of the lower electrode 45.

In the first embodiment, newly added processes of forming the capacitor 64 include a process of forming the resist film 59 shown in FIG. 1F, a process of forming the opening 59B through the resist film 59, a process of forming the capacitor recess 51B shown in FIG. 1G and a process of removing the resist film 59. The upper electrode 63B shown in FIG. 1I is formed at the same time when the wiring 63A and pad 63C are formed in the same layer as that of the upper electrode. It is therefore possible to suppress an increase in the number of processes newly added for forming the capacitor.

In the first embodiment, the via hole 51A for the plug 56 is formed before the capacitor recess 51B shown in FIG. 1G is formed. If this order is reversed, in order not to remove the etching stopper film 50 on the bottom of the capacitor recess 51B when the etching stopper film 50 on the bottom of the via hole 51A is removed, it is necessary to mask the etching stopper film on the bottom of the capacitor recess 51B with a resist film or the like. As in the first embodiment, since the capacitor recess 51B is formed after the via hole 51A is formed, it is possible to omit the process of masking the bottom of the capacitor recess 51B. In the first embodiment, when the resist film 59 shown in FIG. 1F is removed by plasma ashing using $O_2$-containing gas, the upper surfaces of the adhesion layer 55 of TiN and the plug 56 of W are exposed to oxygen plasma. However, even if the surfaces are exposed to oxygen plasma, a contact resistance between the plug 56 and upper wiring 63A can be maintained low, because TiN and W are materials hard to be oxidized.

Further, in the first embodiment, the capacitor recess 51B accommodating the upper electrode 63B is located within the lower electrode 45 as viewed in plan. If the capacitor recess and lower electrode are partially overlapped with each other and there is a position misalignment therebetween, there occurs a change in an area of the region where the upper electrode 63B and lower electrode 45 face each other. However, this area of the region where the upper electrode 63B and lower electrode 45 face each other can be maintained constant even if there is a position misalignment within an allowable range, so long as the capacitor recess 51B is located within the lower electrode 45. It is therefore possible to maintain a targeted capacitance.

Figure 3:
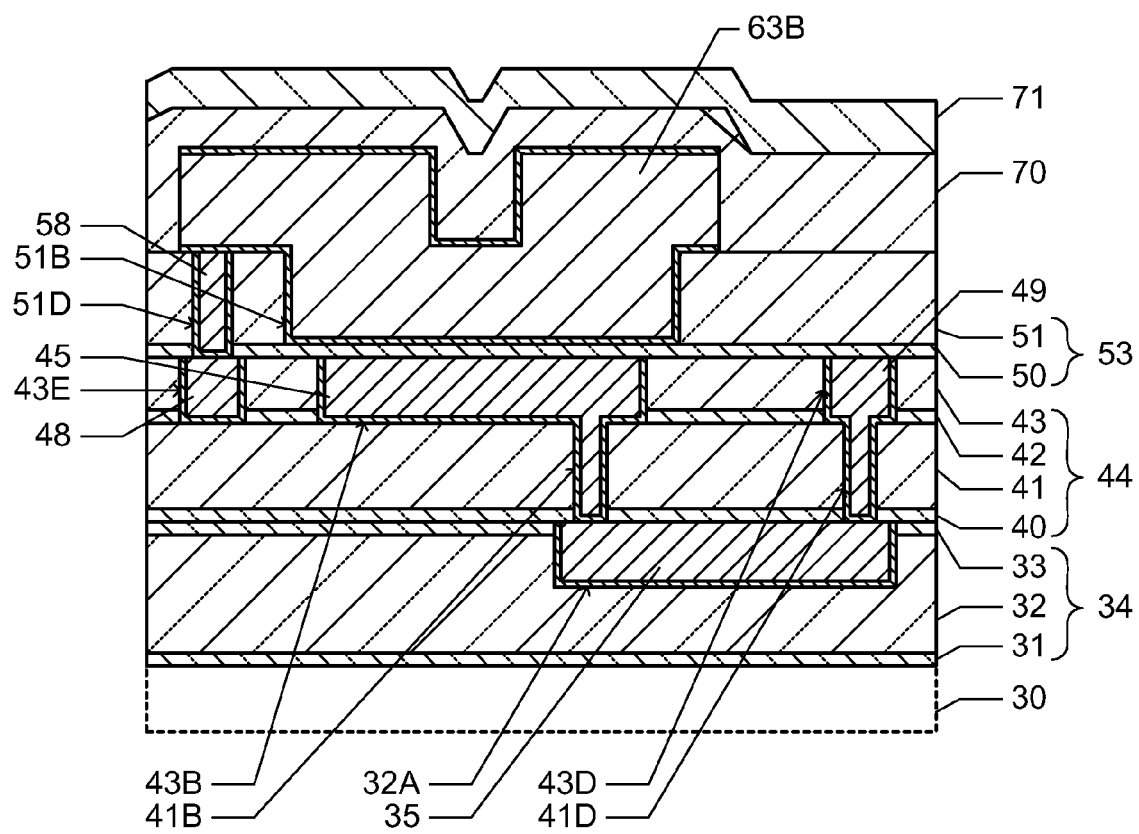
FIG. 3 is a cross sectional view of the semiconductor device according to a second embodiment.
Figure 4:
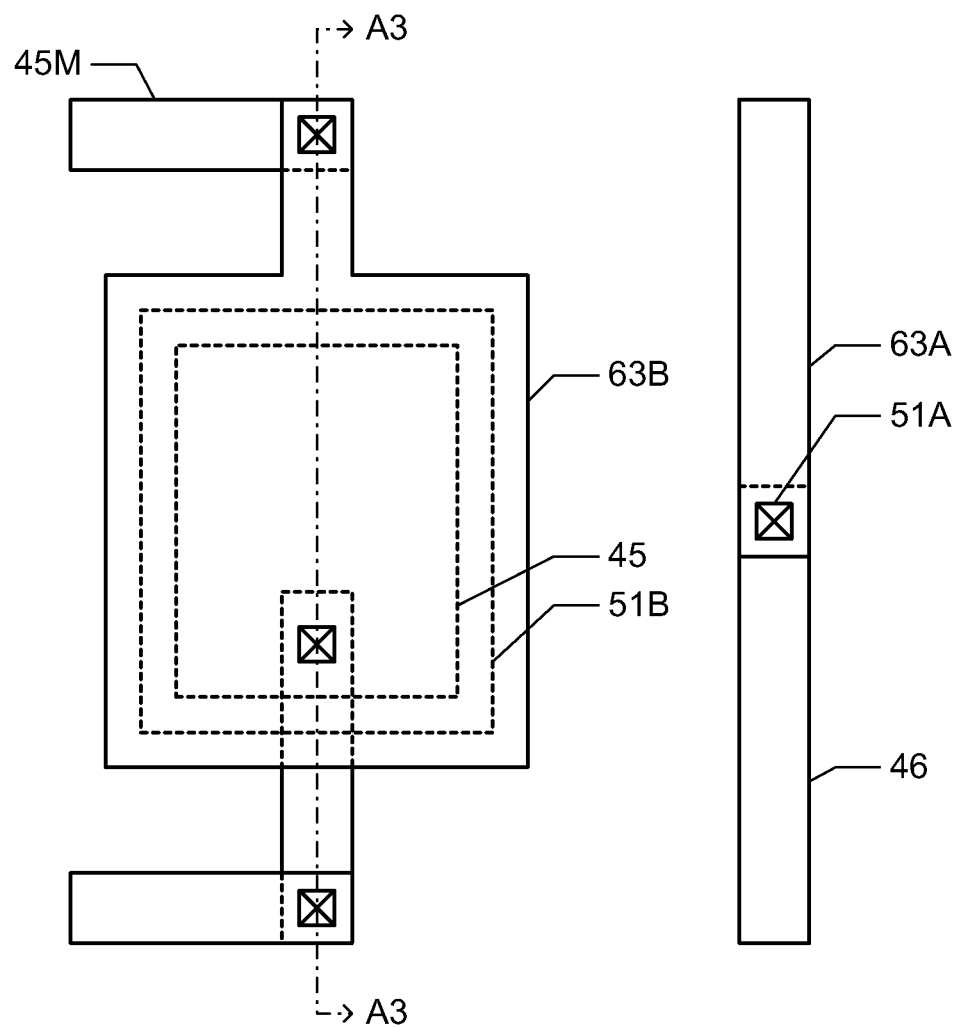
FIG. 4 is a plan view of the semiconductor device according to the second embodiment.

FIGS. 3 and 4 are respectively a cross sectional view and a plan view of a semiconductor device according to the second embodiment. FIG. 3 is a cross sectional view taken along one-dot chain line A3-A3 shown in FIG. 4. Description will be made by paying attention to different points from the semiconductor device of the first embodiment shown in FIGS. 1A to 1J and FIG. 2.

A wiring 35 of copper is embedded in a wiring trench 32A formed in an interlayer insulating film 34 below an interlayer insulating film 44. The inner surface of the wiring trench 32A is covered with a barrier metal film. The copper wiring 35 is formed by a dual damascene method.

A via hole 41B is formed through a via layer insulating film 41 and an etching stopper film 40, extending from the bottom of a capacitor recess 43B to the upper surface of the wiring 35. A barrier metal film covering the inner surface of the capacitor recess 43B continuously covers also the inner surface of the via hole 41B, and a lower electrode 45 is embedded also in the via hole 41B.

In another region of the interlayer insulating film 44, wiring trenches 43D and 43E and a via hole 41D are formed. The via hole 41D extends from the bottom of the wiring trench 43D to the upper surface of the wiring 35. The inner surfaces of the wiring trench 43D and via hole 41D are covered with a barrier metal film, and a conductive member 49 completely fills the wiring trench and via hole. The barrier metal film covers the inner surface of the wiring trench 43E, and the wiring 48 completely fills the wiring trench 43E. The capacitor recess 43B and via hole 41B, and the wiring trench 43D and via hole 41D, are formed by the same process as that of forming the wiring trench 43C and via hole 41C shown in FIG. 1B. The conductive member 49 embedded in the wiring trench 43D and via hole 41D is formed by the same process as that of forming the lower electrode 45.

A via hole 51D is formed in an interlayer insulating film 53, the via hole 51D extending from the bottom of an upper electrode 63B deposited on the interlayer insulating film 53 to the upper surface of a wiring 48. The inner surface of the via hole 51D is covered with a barrier metal film and a plug 58 fills the via hole. In other words, the upper electrode 63B reaches the upper surface of the plug 58. The plug 58 interconnects the upper electrode 63B and wiring 48. This structure is the same as the interconnect structure between the upper electrode 63B and wiring 63A shown in FIG. 1J.

In the second embodiment, as shown in FIG. 4, the outer peripheral line of the capacitor recess 51B accommodating the upper electrode 63B is positioned outside the outer peripheral line of the lower electrode 45, as viewed in plan. The effects of adopting this plan layout will be described with reference to FIGS. 5A and 5B.

Figure 5A:
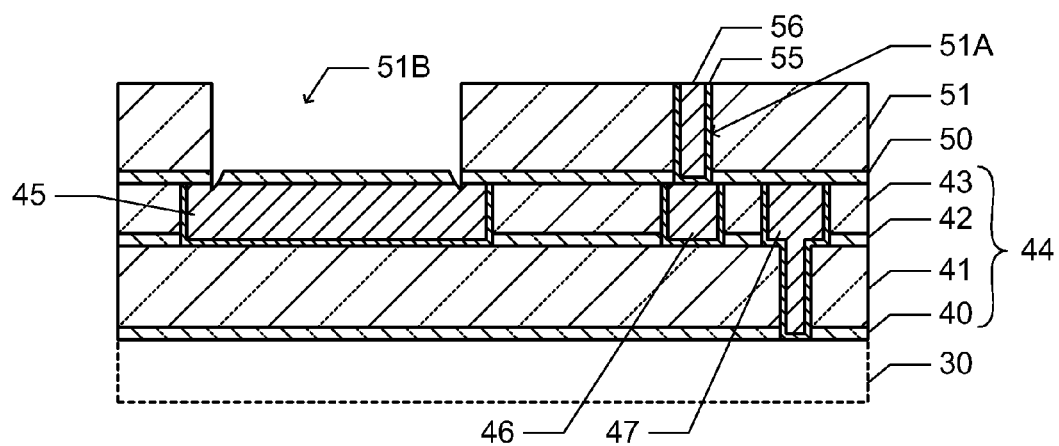
FIG. 5A is a cross sectional view of a semiconductor device during manufacture by a comparative manufacture method.

FIG. 5A is a cross sectional view in which the capacitor recess 51B is located within the lower electrode 45, as viewed in plan. In order to protect the side surface of the capacitor recess 51B while the via layer insulating film 51 is etched, etching gas is mixed with deposition acceleration gas (deposition gas). Byproduct generated by deposition acceleration gas protects the side surface. For example, $CF_4$, $C_4F_8$ or the like is used as etching acceleration gas, and CO or the like is used as deposition acceleration gas.

If a plan shape size is small as in the case of the via hole 51A, an object of protecting the side surface can be achieved. However, if a plan shape size is large as in the case of the capacitor recess 51B, byproduct by deposition acceleration gas protects also the broad bottom so that an etching rate of the bottom lowers. However, byproduct is hard to be deposited in an area near the outer periphery of the bottom, so that an etching rate near the outer periphery is faster than that in a central area. Therefore, as shown in FIG. 5A, the etching stopper film 50 near the outer periphery of the bottom of the capacitor recess 51B is etched excessively, and the lower electrode 45 is exposed in some cases. As the lower electrode 45 is exposed, the lower electrode 45 of the capacitor is short-circuited with the upper electrode covering the inner surface of the capacitor recess 51B.

Figure 5B:
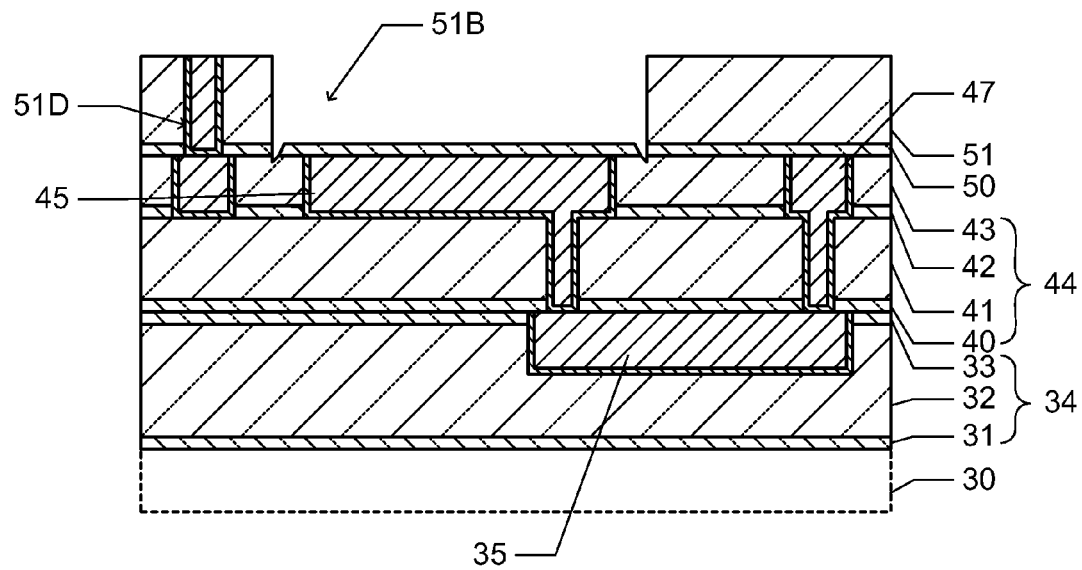
FIG. 5B is a cross sectional view of a semiconductor device during manufacture by the second embodiment method.
Figure 7:
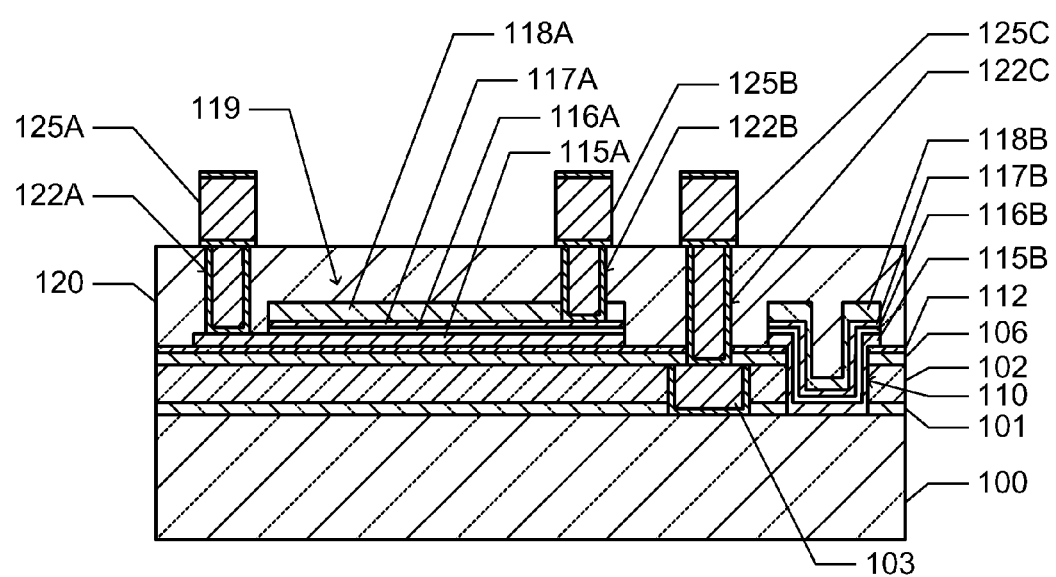
FIG. 7 is a cross sectional view of a conventional semiconductor device having a capacitor.
Figure 8A:
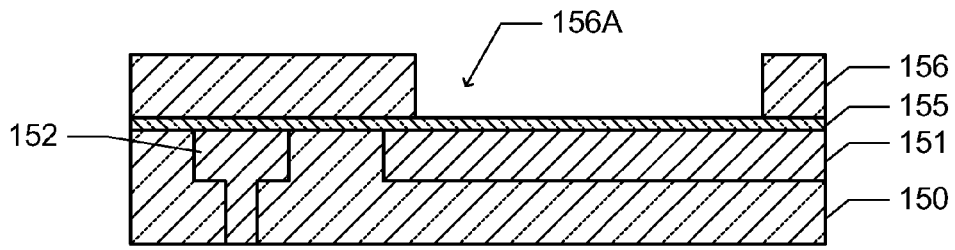
FIGS. 8A to 8D are cross sectional views of a conventional semiconductor device having a capacitor during manufacture.
Figure 8B:
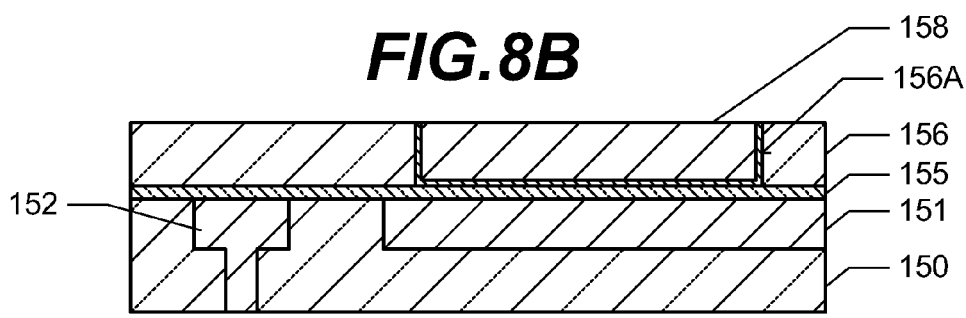
Figure 8C:
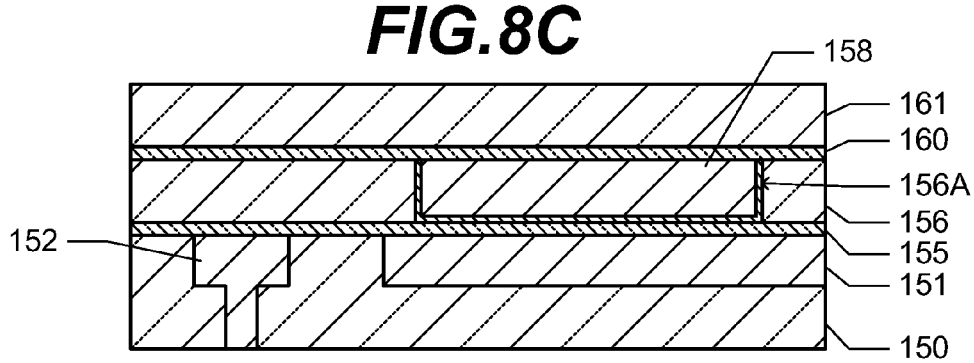
Figure 8D:
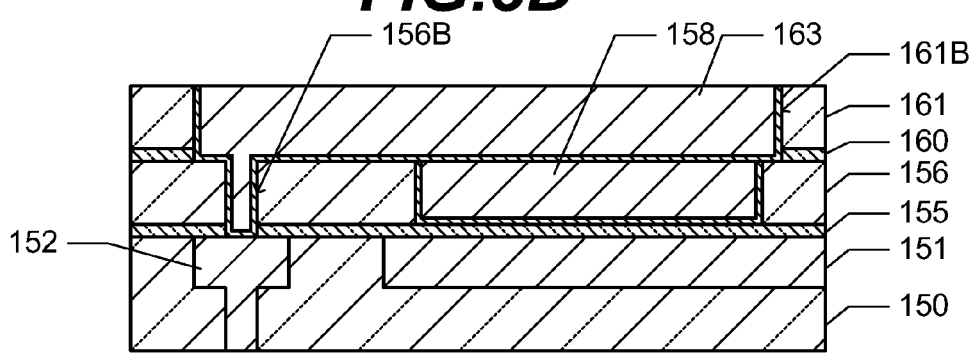

FIG. 5B is a cross sectional view in which the structure of the second embodiment is adopted. Since the outer peripheral line of the capacitor recess 51B is disposed outside the outer peripheral line of the lower electrode 45, even if the etching stopper film 50 near the outer periphery of the bottom of the capacitor recess 51B is etched excessively, the lower electrode 45 is not exposed. It is therefore possible to prevent a short circuit between the lower and upper electrodes of the capacitor.

In the second embodiment, if the wiring 45L connected to the lower electrode 45 is disposed, as in the first embodiment shown in FIG. 2, in the same layer as that of the lower electrode 45, the outer peripheral line of the capacitor recess 51B crosses the wiring 45L, as viewed in plan. If the etching stopper film 50 is etched excessively, the upper electrode and wiring 45L are short-circuited at this cross point. In the second embodiment, the lower electrode 45 is connected to another electronic circuit device via the wiring 35 embedded in the interlayer insulating film 34 below the lower electrode. It is possible to prevent a short circuit between the lead wiring 35 of the lower electrode 45 and the upper electrode 63B covering the inner surface of the capacitor recess 51B.

The area of the region where the lower electrode 45 and upper electrode 63B face each other can be maintained constant even if there is a position misalignment within an allowable range between the capacitor recess 51B and lower electrode 45. It is therefore possible to maintain a targeted capacitance.

Next, with reference to FIGS. 6A to 6C, description will be made on a semiconductor device and its manufacture method according to the third embodiment.

FIG. 6A is a cross sectional view corresponding to FIG. 1F showing the semiconductor device of the first embodiment during manufacture. In the first embodiment, the interlayer insulating film 53 consists of two layers, the etching stopper film 50 and via layer insulating film 51, whereas in the third embodiment, a second-layer etching stopper film 80 and a third-layer etching stopper film 81 are disposed between an etching stopper film 50 and a via layer insulating film 51. The second-layer etching stopper film 80 has an etching resistance different from etching resistances of both the first-layer etching stopper film 50 and the third-layer etching stopper film 81. The third-layer etching stopper film 81 has an etching resistance different from that of the via layer insulating film 51. For example, the first-layer etching stopper film 50 and the third-layer etching stopper film 81 are made of SiN, and the second-layer etching stopper film 80 and the via layer insulating film 51 are made of $SiO_2$. Thicknesses of the first-layer etching stopper film 50 and the second-layer etching stopper film 80 are both 30 nm. A thickness of the third-layer etching stopper film 81 is 70 nm.

By using a resist film 59 as a mask, the via layer insulating film 51 is etched under the condition that the via layer insulating film 51 can be selectively etched relative to the third-layer etching stopper film 81, e.g., by plasma etching using CF-based gas. Thereafter, the resist film 59 is removed by plasma ashing using $O_2$ gas.

As shown in FIG. 6B, a capacitor recess 51B is therefore formed in the via layer insulating film 51. The third-layer etching stopper film 81 is exposed on the bottom of the capacitor recess 51B. Next, the third-layer etching stopper film 81 exposed on the bottom of the capacitor recess 51B is etched under the condition that the third-layer etching stopper film 81 can be selectively etched relative the second-layer etching stopper film 80, e.g., by plasma etching using CHF-based gas. Since the third-layer etching stopper film 81 is sufficiently thinner than that of the via layer insulating film 51, an over-etching amount of the third-layer etching stopper film 81 can be set smaller than an over-etching amount when the via layer insulating film 51 is etched. It is therefore possible to reduce damages of the second-layer etching stopper film 80.

Next, the second-layer etching stopper film 80 exposed on the bottom of the capacitor recess 51B is etched under the condition that the second-layer etching stopper film 80 can be selectively etched relative to the first-layer etching stopper film 50, e.g., by wet etching using hydrofluoric acid.

As shown in FIG. 6C, the first-layer etching stopper film 50 is therefore exposed on the bottom of the capacitor recess 51B. Since the second-layer etching stopper film 80 is etched by wet etching, damages to the first-layer etching stopper film 50 can be reduced, and its thickness can be controlled at a high precision.

In the above-described embodiments, although SiN is used as the material of the etching stopper film, SiC, SiCN, SiON and the like may also be used. These materials have also a Cu diffusion preventive function. In order to enhance the Cu diffusion preventive function, it is preferable to reduce O in SiON. In the above-described embodiments, although $SiO_2$ is used as the material of the via layer insulating film and wiring layer insulating film, SiOC, low dielectric constant (low-k) organic insulating material and the like may also be used.

The present invention has been described in connection with the preferred embodiments. The invention is not limited only to the above embodiments. It will be apparent to those skilled in the art that other various modifications, improvements, combinations, and the like can be made.

I claim:

1. A semiconductor device comprising:
a semiconductor substrate;
a first interlayer insulating film formed over the semiconductor substrate;
a first capacitor recess and a wiring trench formed in the first interlayer insulating film;
a lower electrode formed in the first capacitor recess;
a first wiring formed in the wiring trench;
a first etching stopper film disposed over the first interlayer insulating film;
a via layer insulating film disposed over the first etching stopper film and that includes insulating material having an etching resistance different from an etching resistance of the first etching stopper film;
a first via hole formed in the via layer insulating film and the first etching stopper film and that reaches an upper surface of the first wiring;
a first plug, that include conductive material, formed in the first via hole;
a second capacitor recess formed in the via layer insulating film and that reaches the first etching stopper film, the second capacitor recess at least partially overlapping the lower electrode as viewed in plan; and
an upper electrode disposed covering a bottom surface and a side surface of the second capacitor recess and a partial upper surface of the via layer insulating film continuous with the second capacitor recess, the upper electrode and the lower electrode constituting a capacitor comprising the first etching stopper film as a capacitor dielectric film, wherein
an outer peripheral line of the second capacitor recess is disposed outside an outer peripheral line of the lower electrode, as viewed in plan.

2. The semiconductor device according to claim 1, further comprising a third wiring disposed below the first interlayer insulating film, wherein the lower electrode is connected to the third wiring via a conductive member formed in a second via hole extending downward from a bottom of the lower electrode.

3. The semiconductor device according to claim 1, further comprising
a second etching stopper film formed on the first etching stopper film; and
a third etching stopper film formed on the second etching film and under the via layer insulating film,
wherein the second etching stopper film has an etching resistance different from etching resistances of the first etching stopper film and third etching stopper film, and
the third etching stopper film has an etching resistance different from an etching resistance of the via layer insulating film.

4. The semiconductor device according to claim 1, wherein the upper electrode reaches an upper surface of the first plug, and is electrically connected to the first wiring via the first plug.

5. The semiconductor device according to claim 1, wherein the first etching stopper film includes a recess located along the outer peripheral line of the second capacitor recess.

* * * * *